(12) United States Patent
Ellis

(10) Patent No.: US 6,679,055 B1
(45) Date of Patent: Jan. 20, 2004

(54) ELECTROTHERMAL QUADMORPH MICROACTUATOR

(75) Inventor: Matthew D. Ellis, Allen, TX (US)

(73) Assignee: Zyvex Corporation, Richardson, TX (US)

( * ) Notice: Subject to any disclaimer, the term of this patent is extended or adjusted under 35 U.S.C. 154(b) by 4 days.

(21) Appl. No.: 10/061,775

(22) Filed: Jan. 31, 2002

(51) Int. Cl.$^7$ .................................................. F01B 29/10
(52) U.S. Cl. ............................ 60/527; 60/528; 310/306
(58) Field of Search .................... 60/528, 527; 310/306, 310/309, 307

(56) References Cited

U.S. PATENT DOCUMENTS

| | | | |
|---|---|---|---|
| 4,740,410 A | | 4/1988 | Muller et al. |
| 5,072,288 A | | 12/1991 | MacDonald et al. |
| 5,645,684 A | | 7/1997 | Keller |
| 5,660,680 A | | 8/1997 | Keller |
| 5,870,007 A | | 2/1999 | Carr et al. |
| 5,909,078 A | | 6/1999 | Wood et al. |
| 5,962,949 A | | 10/1999 | Dhuler et al. |
| 6,275,325 B1 | | 8/2001 | Sinclair |
| 6,438,954 B1 | * | 8/2002 | Goetz et al. ................... 60/527 |
| 6,483,419 B1 | * | 11/2002 | Weaver et al. ............... 310/307 |
| 6,510,359 B1 | * | 1/2003 | Merkle et al. ............... 700/121 |
| 6,531,947 B1 | * | 3/2003 | Weaver et al. ............... 310/307 |

OTHER PUBLICATIONS

U.S. patent application Ser. No. 09/569,330, Merkle et al., filed May 11, 2000.
U.S. patent application Ser. No. 09/570,170, Ellis et al., filed May 11, 2000.
U.S. patent application Ser. No. 09/616,500, Ellis et al., filed Jul. 14, 2000.
U.S. patent application Ser. No. 09/643,011, Ellis et al., filed Aug. 21, 2000.

(FJ 10106749), filed Dec. 28, 2001, Mercanzini.
(FJ 10106750), filed Dec. 28, 2001, Mercanzini.
Chen, C. Julian, "Introduction to Scanning Tunneling Microscopy," pp. 224–233, Oxford University Press, New York, 1993.
Murray, R. et al., "A Mathematical Introduction to Robotic Manipulation," pp. 132, CRC Press, New York, 1994.
Fearing, Ronald S., Survey of Sticking Effects for Micro Parts Handling, Proc. IEEE/RSJ Int. Conf. in Intelligent Robots and Systems, vol. 2, Pp. 212–217, Pittsburgh, Aug. 5–9, 1995.
Comtois, John H., et al. "Applications for surface–micromachined polysilicon thermal actuators and arrays," Sensors and Actuators A 58, pp. 19–25, 1997.
Reid, Robert J. et al. "Automated Assembly of Flip–Up Micromirrors," Transducers '97, 1997 International Conference on Solid–State Sensors and Actuators, Chicago, pp. 347–350, Jun. 16–19, 1997.

(List continued on next page.)

Primary Examiner—Sheldon J. Richter
(74) Attorney, Agent, or Firm—Haynes and Boone, LLP

(57) ABSTRACT

In a microactuator having substantially parallel beams, the free ends of the beams are detached from the substrate and rigidly interconnected with one another. Differential thermal expansion of the beams causes deflection of the free ends as a unit laterally away from the thermally expanded beam. Depending on the choice of thermally expanded beam, the deflection can be either in or out of the plane parallel to the substrate. Selective heating is achieved for example by passing electric current through a pair of beams in series. Each beam has an independent electrical contact pad at the base end, and all beams are connected together electrically at the free end. A voltage is applied across the selected beam pads, whereas the non-selected beam pads are disconnected. Multiple microactuators can be combined cooperatively, e.g., to move a stage in a plurality of directions.

8 Claims, 5 Drawing Sheets

OTHER PUBLICATIONS

Keller, C.G. et al., "Hexsil tweezers for teleoperated miscroassembly," IEEE Micro Electro Mechanical Systems Workshop, Nagoya, Japan, pp. 72–77, Jan. 26–30, 1997.

Comtois, John H. et al., "Electrothermal actuators fabricated in four–level planarized surface micromachined polycrystalline silicon," Sensors and Actuators A 70, pp. 23–31, 1998.

Cohn, Michael B. et al., "Microassembly Technologies for MEMS," Proc. SPIE Micromachining and Microfabrication, pp. 216–230, 1998.

Chen, Wen–Chih, et al., "A Novel Single–layer Bi–directional Out–of–plane Electrothermal Microactuator," IEEE, 0–7803–7185–2/02, pp. 693–697, 2002.

* cited by examiner

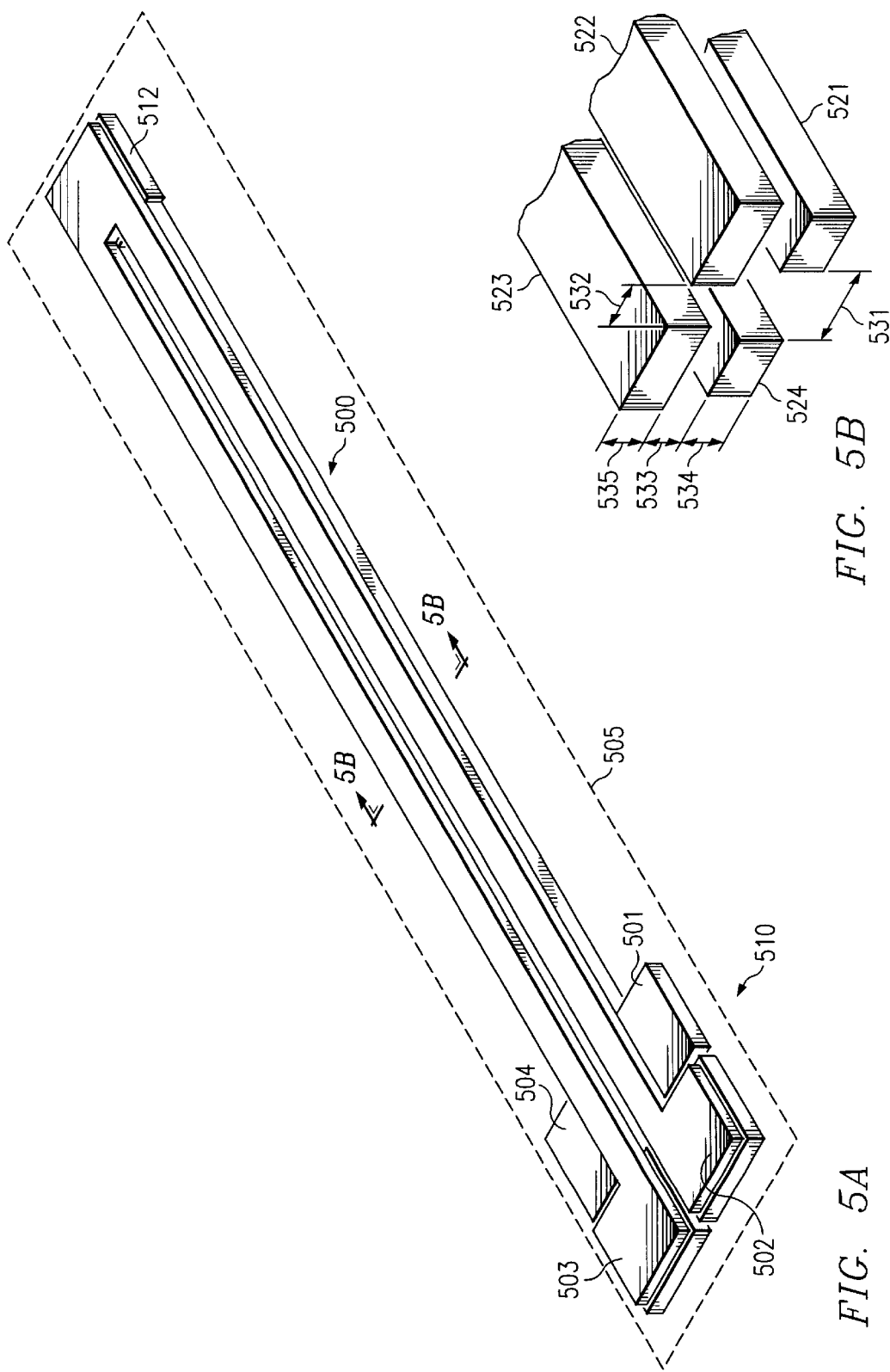

ELECTROTHERMAL QUADMORPH MICROACTUATOR

CROSS-REFERENCE TO RELATED APPLICATIONS

This application is related to and commonly assigned U.S. patent application Ser. No. 09/569,330 entitled "METHOD AND SYSTEM FOR SELF-REPLICATING MANUFACTURING STATIONS," filed May 11, 2000; U.S. patent application Ser. No. 09/570,170 entitled "SYSTEM AND METHOD FOR COUPLING MICROCOMPONENTS," filed May 11, 2000; U.S. patent application Ser. No. 09/616,500 entitled "SYSTEM AND METHOD FOR CONSTRAINING TOTALLY RELEASED MICROCOMPONENTS," filed Jul. 14, 2000; U.S. patent application Ser. No. 09/643,011 entitled "SYSTEM AND METHOD FOR COUPLING MICROCOMPONENTS UTILIZING A PRESSURE FITTING RECEPTACLE," filed Aug. 21, 2000; 10/034,495 entitled "SYSTEM AND METHOD FOR HANDLING MICROCOMPONENT PARTS FOR PERFORMING ASSEMBLY OF MICRODEVICES," filed Dec. 28, 2001; and 10/033,011 entitled "SYSTEM AND METHOD FOR POSITIONAL MOVEMENT OF MICROCOMPONENTS," filed Dec. 28, 2001; the disclosures of which are hereby incorporated herein by reference.

BACKGROUND OF THE INVENTION

The present invention relates to handling of micron scale structures using micro-devices, and more particularly to a system and method for multi-axis controlled translation and rotation of microcomponents using electrothermal microactuators.

Extraordinary advances are being made in micromechanical device and microelectronic device technologies. Further, advances are being made in MicroElectroMechanical Systems ("MEMS"), which incorporate integrated micromechanical and microelectronic devices and components. The term "microcomponent" is used herein generically to encompass microelectronic components, micromechanical components, as well as MEMS components, each generally having at least one dimension in the range between approximately 0.1 micron and 1000 microns. Advances in microcomponent technology have resulted in an increasing number of microcomponent applications. For example, various microcomponents are fabricated and then assembled together. That is, post-fabrication assembly operations may be performed on microcomponents to form devices that may have greater utility.

Accordingly, a need often arises for performing handling tasks for assembling microcomponents. For example, a microcomponent may need to be translated from one position to another position, such that the microcomponent can be presented for assembly together with another microcomponent. As another example, a microcomponent may need to be rotated in some manner such that it is properly oriented for assembly together with another microcomponent. For micro-optical technologies it may be desired to provide controlled movement of a lens with respect to a light source, such as a laser emitter, to produce desired light emission patterns. Similarly, it may be desired to provide controlled movement of an optical fiber end in order to properly interface with a light source.

Because of the small size of microcomponents, handling them to perform such assembly-related tasks is often complex. Due to scaling effects, forces that are insignificant at the macro scale become dominant at the micro scale (and vice versa). For example, when parts to be handled are less than one millimeter in size, adhesive forces can be significant compared to gravitational forces. These adhesive forces arise primarily from surface tension, van der Waals, and electrostatic attractions and can be a fundamental limitation to handling of microcomponents. (See e.g., "A survey of sticking effects for micro parts handling," by R. S. Fearing, Proc. IEEE/RSJ Int. Conf. on Intelligent Robots and Systems, Vol. 2, pp. 212–217, Pittsburgh, Aug. 5–9, 1995; "Hexsil tweezers for teleoperated microassembly," by C. G. Keller and R. T. Howe, IEEE Micro Electro Mechanical Systems Workshop, Nagoya, Japan, Jan. 26–30, pp. 72–77, 1997; and "Microassembly Technologies for MEMS," by Michael B. Cohn, Karl F. Böhringer, J. Mark Noworolski, Angad Singh, Chris G. Keller, Ken Y. Goldberg, and Roger T. Howe, Proc. SPIE Micromachining and Microfabrication, pp. 216–230, 1998.)

Also, relatively precise movement (e.g., translational and/or rotational movement) of a microcomponent is often required to perform assembly operations. Consider, for example, that in some cases mishandling of a part resulting in misalignment of only a few microns may be unacceptable, as the microcomponent to which the part is to be coupled may be only tens of microns in total size, and the portion of the microcomponent that is to be engaged for coupling may be even smaller. Thus, microcomponents present particular difficulty in handling for performing assembly operations.

Traditionally, a high-precision, external robot is utilized for handling of microcomponents to perform assembly operations. For instance, a high-precision, external robot having three degrees of translational freedom (e.g., capable of translating along three orthogonal axes X, Y, and Z) and having three degrees of rotational freedom may be used for handling microcomponents to perform assembly operations. For example, PolyTec PI manufactures a five degree of freedom robotic system specifically designed for high precision assembly of fiber optic modules. However, such external robots are generally very expensive. Additionally, external robots typically perform microcomponent assembly in a serial manner, thereby increasing the amount of time required for manufacturing micro-devices. That is, such robots typically handle one microcomponent at a time, thereby requiring a serial process for assembling microcomponents together.

Accordingly, MEMS systems have been developed to provide translation of a specimen in particular directions. For example, micro-translation systems have been developed in which a microcomponent stage, upon which a specimen may be placed or mounted, is operatively coupled to an actuator to provide controlled movement of the stage and, accordingly, translation of the specimen. Multiple actuators may be disposed in such a micro-translation system to provide a configuration in which motion in multiple directions may be provided, such as along both the X and Y axes.

In the prior art, bimorph actuators or thermal bimorph actuators generally move laterally in a plane of motion of the actuator. Surface micro-machined polysilicon thermal actuators and arrays traditionally have a hot arm and a cold arm. The hot arm is typically thinner and therefore more resistive than the cold arm. When passing electric current through those two arms in series, the hot arm due to its higher resistance heats and expands more than the cold arm, causing the free end of the actuator to move in an arcing motion.

"Applications for Surface-Micromachined Polysilicon Thermal Actuators and Arrays" by Comtois and Bright, Sensors and Actuators A 58, pp. 19–25, 1997, and "Electrothermal actuators fabricated in four-level planarized surface micromachined polycrystalline silicon," by Comtois et al., Sensors and Actuators A 70, pp. 23–31, 1998, describe thermal bimorph actuators having hot and cold arms, that provide motion only in a single direction along a single axis. "Automated Assembly of Flip-Up Micromirrors," by Reid et al., 1997 International Conference on Solid-State Sensors and Actuators, Chicago, pp. 347–330, June 1997, describes a "back-bending" capability, such that the material of the hot arm reflows and shortens when pressed down towards a substrate at high temperature during the heating cycle, causing the actuator to bend in the opposite direction away from the substrate during a subsequent cooling cycle. U.S. Pat. No. 6,275,325/B1 (hereafter the '325 patent) issued Aug. 14, 2001, describes an actuator that can move in one direction along one axis. Instead of thinning the hot arm to increase electrical resistance, the cold arm includes a metallic layer that reduces electrical resistance. Multiple actuators of this type are coupled to a stage, for example four actuators, which can then lift the stage along the Z axis and/or rotate it about any combination of the X and Y axes.

U.S. Pat. No. 5,909,078 (hereafter the '078 patent), issued Jun. 1, 1999, describes various single direction thermal actuators known as thermal arch beam actuators.

U.S. Pat. No. 5,962,949 (hereafter the '949 patent), issued Oct. 5, 1999, describes an apparatus that can produce XYZ motion in three orthogonal directions by cascading three thermal arch beam actuators. The '949 patent describes two substantially identical single direction actuators independently driving a stage along the X and Y axes. A third actuator producing upward Z motion is embedded in the stage.

U.S. Pat. No. 5,870,007 (hereafter the '007 patent), issued Feb. 9, 1999, describes a set of bimorph actuators that are coupled to a stage, which they can move in multiple directions. Each individual actuator has a "meander cantilever" configuration and provides motion only in one direction. A single actuator is not capable of both in-plane and out-of-plane motion. To move the stage in multiple directions requires multiple actuators.

It is possible to design in-plane actuators that move in two directions. One prior art micro-translation system utilizes a plurality of thermal actuators (also referred to as heatuators) for in-plane translation. Directing attention to FIG. 1, micro-translation system 100 is shown including thermal actuators 110 and 120 directly coupled to stage 130 by flexures. Thermal actuators 110 and 120 are oriented to provide translation of stage 130, and components placed thereon, along both the X and Y axes. Specifically, thermal actuator 110 is coupled to stage 130 by flexure 131 and provides translation of stage 130 substantially along the X axis when hot-arm 111 is expanded by Joule heating and anchor 114, cold-arm 112, flexure 113, and anchor 115 cause transfer of lateral motion to flexure 131. Similarly, thermal actuator 120 is coupled to stage 130 by flexure 132 and provides translation of stage 130 substantially along the Y axis when hot-arm 121 is expanded by Joule heating and anchor 124, cold-arm 122, flexure 123, and anchor 125 cause transfer of lateral motion to flexure 132.

It should be appreciated, however, that micro-translation systems of the prior art utilizing thermal actuators in such a configuration suffer from several disadvantages. One such disadvantage is that the motion actively imparted by a given thermal actuator is generally unidirectional. Moreover, attempts to provide bi-directional motion using such micro-translation systems generally require substantial post-processing manufacturing steps, such as to electronically isolate the thermal actuators associated with different directions of motion, thereby making such systems difficult to implement. Additionally, the range of motion associated with the use of thermal bimorph actuators is limited to approximately 5 per cent of the overall length of the actuator. A further disadvantage is that translation of the micro-translation system stage along either axis is not independent of translation along the other axis. For example, translation of stage 130 provided by thermal actuator 120 along the Y axis will result in some translation of stage 130 along the X axis due to the torsional distortion of thermal actuator 120. This movement along the unselected axis is further aggravated due to the connection of connecting member 131 and thermal actuator 110 thereto.

Other known prior art micro-translation systems utilize indirect translation mechanisms. Directing attention to FIG. 2, micro-translation system 200 is shown utilizing indirect drive means. In the system of FIG. 2, a translation mechanism is disposed on each side of, and in the same plane with, stage 230 to controllably engage stage 230 and provide translation in a predetermined direction. Specifically, translation mechanism 210 includes actuator banks 211 and 212 coupled to lateral translation gear 231 by connecting arms 214 and 215, respectively. Similarly, translation mechanism 220 includes actuator banks 221 and 222 coupled to lateral translation gear 232 by connecting arms 224 and 225, respectively. Actuator banks 211, 212, 221, and 222 may comprise an array of thermal actuators, such as are shown in detail above in FIG. 1, and are oriented to provide translation of stage 230, and components placed thereon, along the X axis by causing lateral translation gears 231 and 232 to engage corresponding racks 233 and 234 using Y axis movement associated with actuator banks 211 and 221. Thereafter, movement along the X axis is provided by lateral movement of engaged translation gears 231 and 232 causing corresponding movement in racks 233 and 234, and thus stage 230, using X axis movement associated with actuator banks 212 and 222. Lateral translation gears 231 and 232 may then be disengaged from corresponding racks 233 and 234, again using Y axis movement associated with actuators 211 and 221, and re-engage with corresponding racks 233 and 234 at a different point, using X axis movement associated with actuators 212 and 222, for further movement of stage 230. An indirect thermal actuator drive mechanism similar to that of FIG. 2 is described in Reid et al. (1997), cited above.

Micro-translation systems of the prior art utilizing the above described indirect thermal actuator drive mechanisms suffer from several disadvantages. For example, although the range of motion is appreciably improved over that of the direct thermal actuator drive mechanism of FIG. 1, prior art configurations of such micro-translation systems provide translation of a stage along a single axis and, therefore, no prior art configuration has been proposed to provide movement along two axes which may be produced without substantial post-production manufacturing steps, i.e., no configuration is known in the prior art which may be produced using a monolithic manufacturing process.

Still other prior art micro-translation systems have implemented scratch drive actuators (SDAs) to provide translation of a stage. Directing attention to FIG. 3, one configuration of a SDA as is well known in the art is shown as SDA 310. Specifically, SDA 310 comprises plate 311, torsion mounts 312, and bushing 313. For operation, SDA 310 is disposed upon a substrate such that a conducting layer, such as conducting layer 322, is in juxtaposition with plate 311 and an insulating layer, such as insulating layer 321, is disposed therebetween.

Operation of SDA 310 is illustrated in FIGS. 4A–4C. Specifically, FIG. 4A shows voltage source 410 coupled to plate 311 and conducting layer 322 without any voltage applied thereto. However, as shown in FIG. 4B, a priming voltage may be provided by voltage source 410 and an electrostatic field associated therewith causes deflection of plate 311 such that its distal end is drawn toward conducting layer 322. As shown in FIG. 4C, the voltage provided by voltage source 410 may be increased to that of a stepping voltage such that plate 311 is more fully drawn toward conducting layer 322 causing bushing 313 to be displaced such that a distal end thereof steps forward distance "S". Reducing the voltage provided by voltage source 410 to the priming voltage or below causes plate 311 to move forward distance "S" as bushing 313 is again righted, i.e., SDA 310 returns to an orientation as shown in FIG. 4A or 4B.

Although SDAs are generally useful in providing a relatively large range of linear motion, implementation of such actuators is still fraught with problems. For example, the use of such SDAs has generally required the use of a wire tether to provide activating potential to the SDA plate while accommodating the motion of the SDA. Moreover, although a bank of SDAs may be produced using a monolithic manufacturing process, all such SDAs have heretofore been electrically interconnected, causing all such SDAs in the bank to be activated simultaneously. Accordingly, in the prior art true independent bi-directional implementations of SDAs have not been provided using monolithic manufacturing processes, as the SDAs of each such direction have been electrically interconnected and thus operable only simultaneously. In order to provide SDAs which are independently operable in multiple directions, prior art implementations have required substantial post-processing manufacturing steps, such as to electronically isolate the SDAs associated with different directions of motion, thereby making such systems difficult to implement fully with monolithic production processes.

U.S. Pat. No. 5,072,288 (hereafter the '288 patent), issued Dec. 10, 1991, describes microdynamic structures, including tweezers and actuators, that deflect along one or two axes by the application of electric potential differences to generate electrostatic forces. This technique, however, results in a limited range of motion and is dependent on the proximity of a deflecting beam to an electrically charged surface, which can be another deflecting beam. Additionally, instabilities in motion and deflection occur at short distances between the beam and the respective charged surface.

Accordingly, a need exists in the art for systems and methods to provide a relatively large range of stable motion in multiple directions with respect to a microcomponent. A need exists in the art for such multiple directions of motion to include bidirectional motion and/or motion along different (e.g., orthogonal) axes.

Moreover, a need exists in the art for systems and methods to provide a relatively large range of motion which may be produced using substantially monolithic manufacturing processes.

SUMMARY OF THE INVENTION

The present invention is directed to a system and method for providing independently controllable movement of microcomponents in a plurality of directions. In a microactuator having at least four substantially parallel longitudinal beams, each having a base end independently rigidly interconnected with a substrate, and a free end longitudinally opposite said base end, the free ends of all of the beams are detached from the substrate and rigidly interconnected with one another. By selectively thermally expanding at least one beam relative to the other beams, a bending moment is transmitted to the microactuator structure, causing controllable deflection of the free ends as a unit laterally away from the selectively thermally expanded beam(s). Depending on the choice of thermally expanded beam(s), the deflection can be in either of the intersecting lateral planes substantially parallel to the longitudinal beams.

In embodiments of the present invention, selective heating is achieved through a pair of beams by passing an electric current through them in series. Each beam has an independent electrical contact pad at the base end, and all beams are connected together electrically at the opposite free end. Selectivity is achieved by connecting a voltage across the pads of the selected beams and disconnecting the pads of the non-selected beams. In some embodiments, multiple microactuators are combined cooperatively, e.g., to move a stage in a plurality of directions.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which:

FIG. 5A is a 3D schematic representation depicting a quadmorph microactuator incorporating four beams, in accordance with embodiments of the present invention;

FIG. 5B is a cross-sectional representation taken along direction 5B—5B of FIG. 5A;

DETAILED DESCRIPTION OF THE INVENTION

Figure 1:
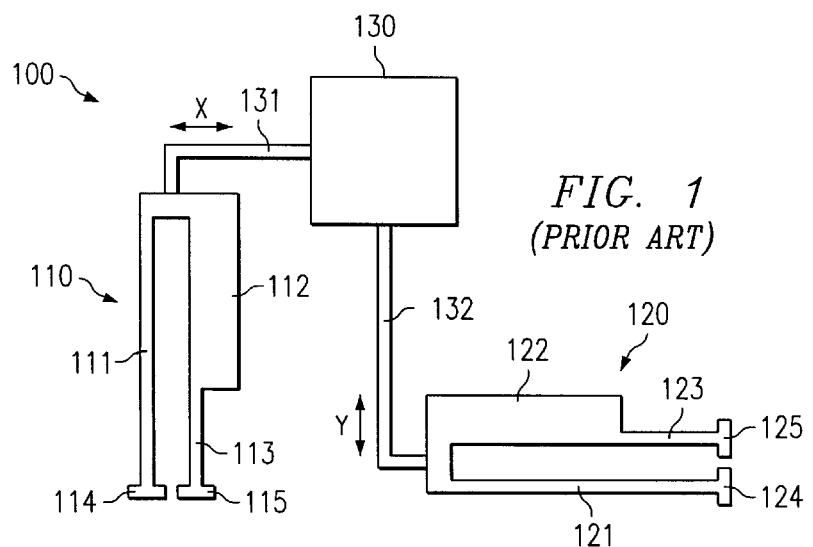
FIG. 1 is a diagram depicting a prior art micro-translation scheme.
Figure 2:
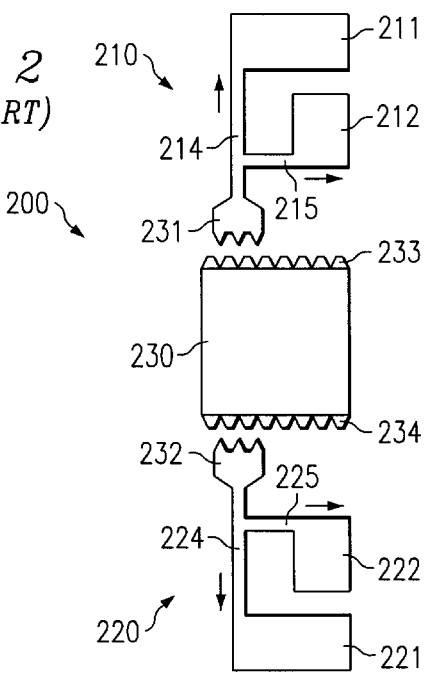
FIG. 2 is a diagram illustrating a prior art micro-translation system utilizing indirect drive means.
Figure 3:
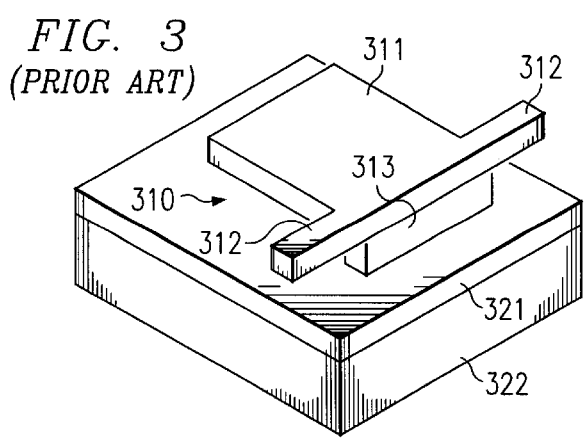
FIG. 3 is a diagram representing a prior art scratch drive actuator.
Figure 4A:
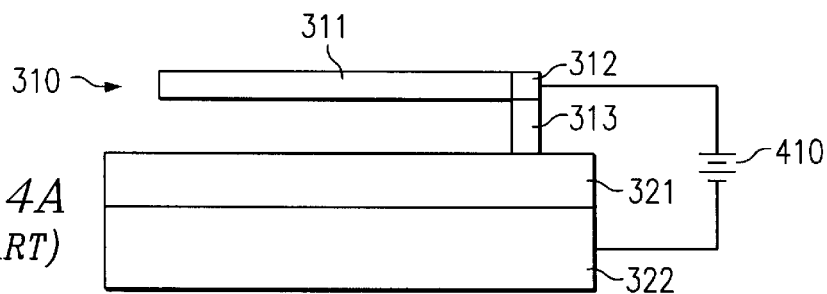
FIGS. 4A–4C are diagrams illustrating sequentially the operation of a prior art scratch drive actuator.
Figure 4B:
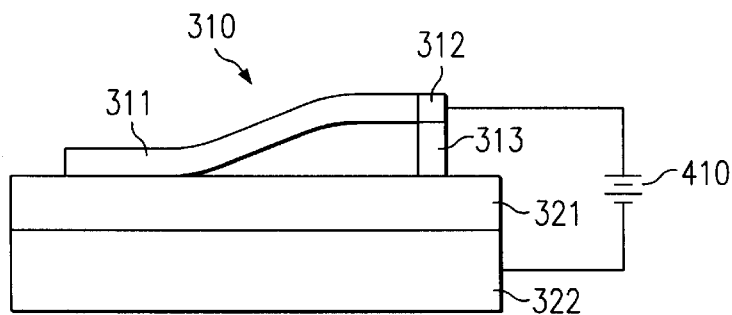
Figure 4C:
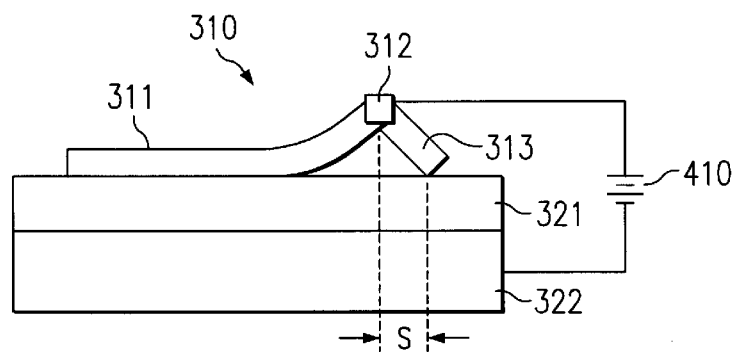

A quadmorph electrothermal microactuator in accordance with at least one embodiment of the present invention incorporates four substantially parallel beams of substantially equal length. Two upper beams are directly above two lower beams. The four beams are individually anchored to a substrate at one end (base end); at the other end (free end) the two upper beams are connected together, and are connected to two lower beams, which are also connected together. At this free end, the four beams are essentially free to move together as a unit with respect to the substrate, but not with respect to each other.

Embodiments of the present invention provide a single actuator that generates motion in two orthogonal directions—both parallel to the substrate (in-plane) and perpendicular to the substrate (out-of-plane). Prior art thermal actuators only provide motion in one direction (as with a thermal actuator) or two directions (as with a bidirectional thermal actuator) along a single axis. Prior art actuators also use only a single structural layer, whereas by using two structural layers in embodiments of the present invention, motion in two orthogonal directions is achieved. Four electrical connections are utilized to operate the actuator.

FIG. 5A is a 3D schematic representation depicting a quadmorph microactuator incorporating four beams, in accordance with embodiments of the present invention. FIG. 5B is a cross-sectional representation taken along direction 5B—5B of FIG. 5A. Actuator 500 has four electrically conducting pads 501–504 electrically isolated from one another anchored to substrate 505 and connected to respective beams 521–524 at base end 510 opposite free end 512 of actuator 500.

Each individual beam is connected to an individual pad. Beam 521 (lower right hand beam in FIG. 5B) is connected to pad 501. Upper right hand beam 522 is connected to pad 502. Lower left hand beam 524 is connected to pad 504, and upper left hand beam 523 is connected to pad 503. At free end 512, all four beams 521–524 are essentially joined together but are not anchored to substrate 505.

Actuator 500 in the present embodiment is fabricated of two layers of polysilicon using the Multi-User MEMS Process (MUMPS). The MUMPS process consists essentially of a sequence of fabrication steps familiar in semiconductor manufacturing technology, including photolithographic patterning and masking, deposition, etching, and use of sacrificial material layers to provide release between structural members. Upper beams 522–523 are formed in an upper POLY2 layer, and lower beams 521, 524 are formed in a lower POLY1 layer. Although the compositions of POLY1 and POLY2 layers are typically substantially identical, in some implementations POLY1 and POLY2 layers may have differing compositions. A description of the MUMPS fabrication process in the '325 patent, cited above, is hereby incorporated herein by reference. However, the apparatus of the present invention does not employ the specific masks and dimensions described in the '325 patent, but rather employs masks and dimensions specific to the structure of the present invention.

The MUMPS fabrication process is not an aspect of the present invention and is only one of several processes that can be used to make the structures according to the present invention. For example, co-pending and commonly assigned U.S. Patent application Serial Number 10/033,011, cited above, the disclosure of which has been incorporated herein by reference, describes monolithic manufacturing of microtranslation systems providing for operation of the microtranslation system throughout a relatively large range of motion without requiring post-processing manufacturing steps, i.e., without employing manufacturing steps with respect to a monolithically produced micro-translation system after its removal from the monolithic substrate (after "breaking silicon").

Any suitable fabrication process now know or later developed that is capable of fabricating four beams that are each coupled to separate, electrically isolated pads may be used. For example a monolithic lay-up, such as may result from operation of monolithic manufacturing processes, is shown and described in above cited co-pending and commonly assigned U.S. patent applications Ser. Nos. 09/569,330 and 09/616,500. Monolithic manufacturing processes that may be utilized in fabricating embodiments of the present invention may additionally or alternatively implement fabrication processes disclosed in U.S. Pat. No. 4,740,410 issued to Muller et al., U.S. Pat. No. 5,660,680 issued to Keller, and/or U.S. Pat. No. 5,645,684 issued to Keller, the disclosures of which are hereby incorporated herein by reference.

Figure 6:
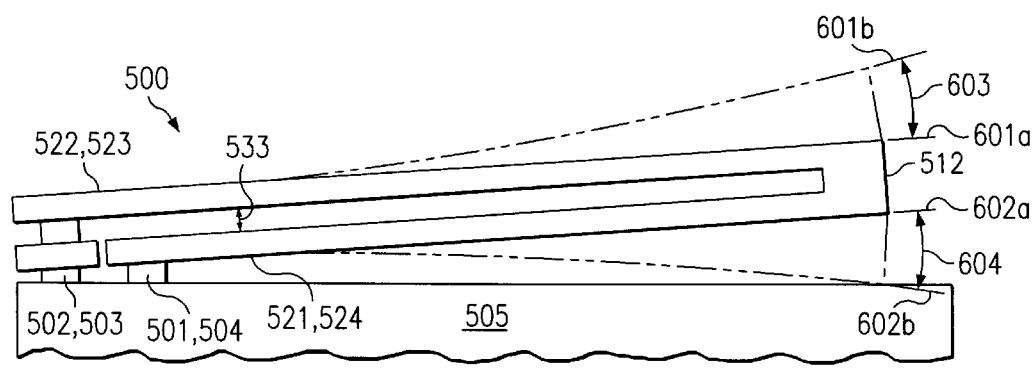
FIG. 6 is a side view illustrating the operation in the XZ plane of a quadmorph actuator, in accordance with embodiments of the present invention.

FIG. 6 is a side view illustrating the operation in the XZ plane of actuator 500, in accordance with embodiments of the present invention. When voltage is applied between pads 501 and 504, current flows only through lower two beams 521, 524 (POLY1) connected to one another electrically in series. Beams 521, 524 are consequently heated, and they expand more than upper two beams 522, 523, which do not carry current because pads 502 and 503 are disconnected from any electric current source. Consequently free end 512 of actuator 500 moves away from substrate 505, such that upper surface 601a of upper beams 522, 523 moves upward through a gradual arc 603 to gradually curved surface 601b.

Likewise, a voltage applied between pad 502 and pad 503 causes current to flow only through upper two beams 522, 523 (POLY2), which are connected to one another electrically in series. Beams 522 and 523 consequently become heated and expand more than lower two beams 521, 524, which carry no current, because pads 501 and 504 are disconnected from any electric current source. That causes free end 512 of actuator 500 to move downward toward substrate 505, such that lower surface 602a of lower beams 521, 524 moves downward through a gradual arc 604 to gradually curved surface 602b. In the example shown, the downward motion of free end 512 is obstructed when free end 512 presses against substrate 505. In other implementations, clearance between beams 521, 524 and substrate 505 allows free end 512 to move downward unobstructed through its full range of motion without contacting substrate 505. For example, in certain implementations, substrate 505 may not extend the full length of the actuator's beams (e.g., a portion of the substrate may be cut away).

Figure 7:
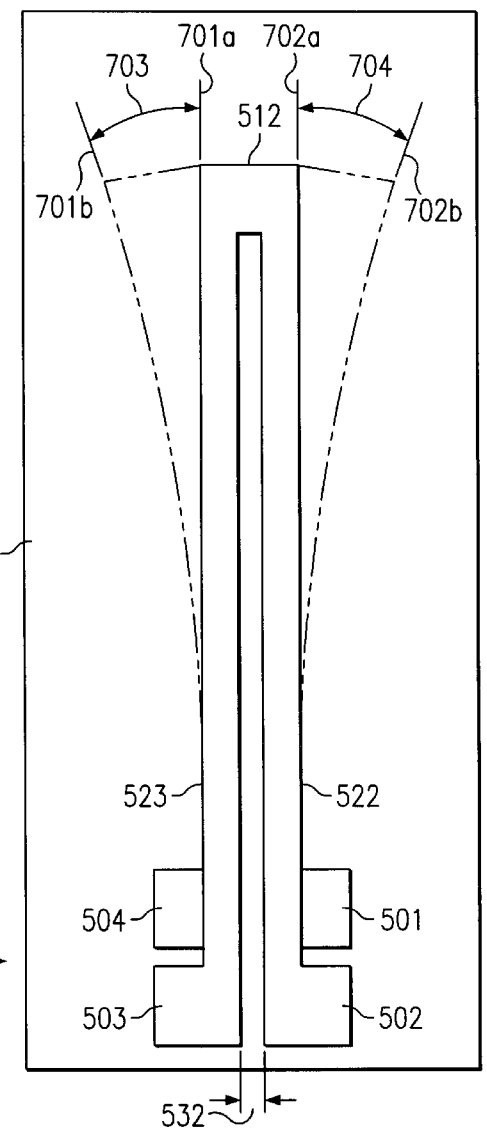
FIG. 7 is a top view illustrating the operation in the XY plane of a quadmorph actuator, in accordance with embodiments of the present invention.

FIG. 7 is a top view illustrating the operation in the XY plane of actuator 500, in accordance with embodiments of the present invention. Applying voltage to pads 501 and 502, current flows only through polysilicon beams 521, 522 on the right side of actuator 500, which are connected together electrically in series. Beam 521 is not shown in FIG. 7, because it lies directly below beam 522. Both beams 521, 522 consequently become heated and expand more than left side beams 523, 524, which carry no current. This causes a bending of quadmorph actuator 500, such that surface 701a at free end 512 moves laterally to the left through gradual arc 703 toward surface 701b. Conversely, applying voltage between pads 503 and 504 causes two left arms 523, 524 to heat and expand, such that surface 702a at free end 512 of actuator 500 moves laterally to the right through gradual arc 704 toward surface 702b. Likewise beam 524 is not shown in FIG. 7, because it lies directly below beam 523.

Thus, applying a voltage across pads 501 and 502 causes current to flow through right two polysilicon beams 521, 522. This current flow creates joule heating that expands beams 521, 522 relative to beams 523, 524 and causes free end 512 of actuator 500 to move to the left. A voltage applied across pads 502 and 503 causes heating of top two beams 522, 523 and deflection of free end 512 of actuator 500 downward toward substrate 505. A voltage applied across pads 503 and 504 causes heating of left two beams 523, 524, and free end 512 consequently deflects to the right. Finally, a voltage applied across pads 501 and 504 causes two lower beams 521, 524 to expand, and free end 512 consequently deflects upward away from substrate 505.

In accordance with embodiments of the present invention, it is advantageous to fabricate actuator 500 as a monolithic polysilicon structure incorporating four beams 521–524 with both POLY1 and POLY2 layers formed in contact with one another at free end 512. In this manner, free end 512 acquires high mechanical integrity needed to withstand repetitive stresses due to differential thermal expansion and flexing of beams 521–524.

Referring again to FIGS. 5A–5B, upper beams 522, 523 and lower beams 521, 524 have slightly different cross-sections, due to the specifications of the MUMPs fabrication process. Alternatively, actuator 500 could be fabricated in another process, such that for example all four beams have equal cross-sectional areas or different cross-sectional areas. Conversely, in some embodiments one or more beams can have a cross-sectional shape other than rectangular. Gap spacings 531, 532 between the two POLY1 beams 521, 524 and two POLY2 beams 522, 523 respectively are likewise dependent on the processing used for fabricating microactuator 500. The same holds for gap 533 between POLY1 and POLY2. Using the MUMPs process, gap 533 is 750 nanometers, but with a different process, gap 533 could be different, for example two microns. In the present implementation, thickness 534 of POLY1 is 2 microns and thickness 535 of POLY2 is 1.5 microns. Consequently, actuator 500 altogether is about 3.5 microns thick, plus gap thickness 533, or overall roughly 4.25 microns thick.

Actuator beams 521–524 can be made as long as desired. When beams 521–524 are longer, there is more range of movement but less rigidity (and therefore less transmitted force) at free end 512 of actuator 500, and it requires more power and more heat to generate the desired movement. For example, in FIGS. 5A–5B, 6, and 7, actuator 500 is approximately 200 microns long from free end 512 to pads 501–504. At full applied voltage, the maximum range of motion at free end 512 is about 6 to 8 microns in each direction, e.g., to the left, to the right, or up. When actuator 500 moves down, substrate 505 blocks the way, such that actuator 500 strikes substrate 505 before it travels its full distance. However, if actuator 500 were reconfigured to provide sufficient clearance from substrate 505, it would then have a full downward range of about 6 to 8 microns.

The deflection of actuator 500 in any of the above cases is dependent on the thermal expansion, which in turn is dependent on the current flow through respective beams 521–524. Although this dependence is not necessarily linear, it is nevertheless predictable. Thus it will be recognized by those skilled in the art that the amount of deflection for a given current can be calibrated and/or feedback controlled using sensors Unlike the prior art, where hot beams and cold beams are distinguished geometrically by having different cross-sectional areas or metallic layers, hot and cold beams of actuators according to embodiments of the present invention are determined dynamically by connecting desired pads to electric current sources, independent of the cross-sectional areas or electrical compositions of the respective beams. For example, when conducting current from pad 501 to pad 504, pad 502 and pad 503 are completely disconnected from electric current sources, such that essentially no current flows through POLY2 beams 522 and 523. Under these conditions, the only source of heat to POLY2 beams 522, 523 is just via conducted and convected secondary heat transfer from adjacent POLY1 beams 521 and 524.

When a beam pair is energized, the actuator deflects through its full 8 micron range of motion within millisecond time scales. Because of the small structure size, thermal equilibrium will also be reached quickly. At thermal equilibrium, steady-state secondary heat transfer occurs from the energized beam pair and the adjacent unenergized beam pair, but the unenergized beam pair always remains cooler than the energized beam pair. Further, the 8 micron deflection range already takes account of the effects of secondary heat transfer.

Although heating of actuator beams by selectively conducting electric current through them is considered the most efficient and convenient method, alternative heating techniques can be employed. For example, although heating could be provided by absorption of selectively directed laser radiation, it may be difficult to direct a laser exclusively at one small pair of target actuator beams without undesirably heating other nearby actuator beams. Likewise, if heating were to use some other external source, there is a high likelihood of heating all the beams at once. Therefore selective current flow is considered an advantageous method.

Embodiments of the present invention can incorporate more or fewer than four substantially parallel beams. For example, an electrothermal actuator in accordance with embodiments of the present invention can have 3 beams arranged laterally in a triangular pattern with free ends conductively joined together and base ends individually electrically isolated and anchored on a substrate. When electrical current is conducted through any two beams in series, the actuator will deflect generally toward the third (electrically disconnected) beam. Depending on the detailed geometric arrangement and th e selection of conducting beams, th e actuator can deflect unidirectionally in each of three intersecting planes.

Figure 8:
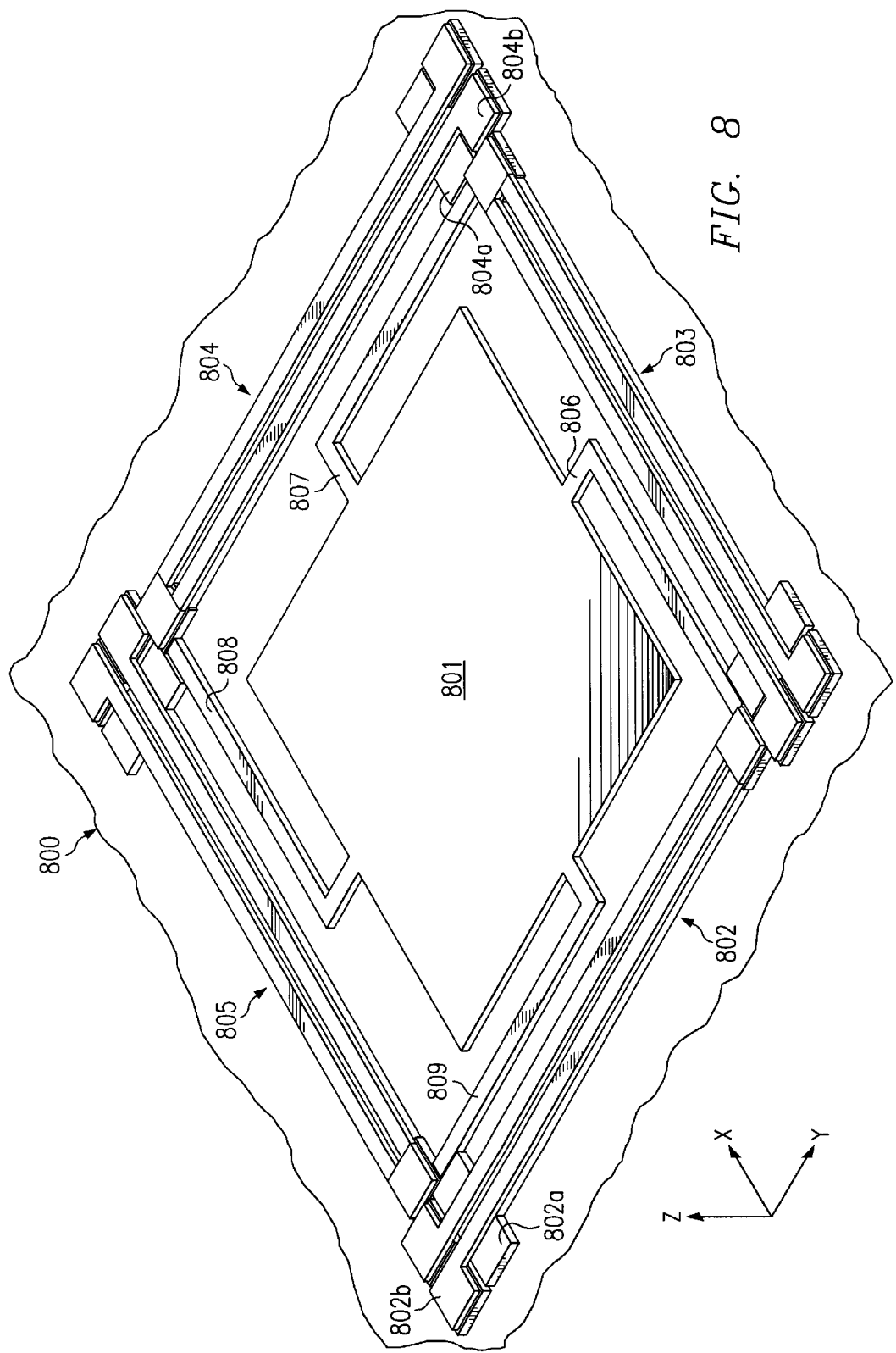
FIG. 8 illustrates an exemplary application to an XYZ stage using four quadmorph actuators, in accordance with embodiments of the present invention.

FIG. 8 illustrates an exemplary application to an XYZ stage using four quadmorph actuators, in accordance with embodiments of the present invention. As indicated by coordinate axes XYZ, central stage 801 above substrate 800 lying in the XY plane perpendicular to the Z direction is coupled through flexures 806, 807, 808, and 809 respectively with four quadmorph actuators 802, 803, 804 and 805, arranged in a fourfold rotationally symmetric configuration about the Z axis in the XY plane.

To translate stage 801 in the positive X direction, current is delivered through the two polysilicon beams on the inner side (closest to stage 801) of actuator 804 by applying voltage between pads 804a and 804b, causing actuator 804 to move away from stage 801 in the XY plane, thus pulling stage 801 via flexure 808 in the positive X direction. Likewise, translation in the positive X direction results from activating the two polysilicon beams on the outer side (farthest from stage 801) of actuator 802 by applying voltage between pads 802a and 802b, causing actuator 802 to move toward stage 801 in the XY plane, thus pushing stage 801 via flexure 806 in the positive X direction. It is clear that actuators 802 and 804 can be activated as described above simultaneously, thus cooperatively translating stage 801 in the positive X direction. As can be recognized by those skilled in the art, counterparts to the positive X translation described above occur for negative X, positive Y, or negative Y translation of stage 801 employing beams of appropriate actuators.

To translate stage 801 vertically away from substrate 800, voltage is applied simultaneously between the POLY1 pads on all four actuators. This causes only the lower POLY1 beams to heat and to lift stage 801 upward away from substrate 800. To move stage 801 downward toward substrate 800, voltage is applied simultaneously between all the POLY2 pads on all four actuators to drive stage 801 toward substrate 800. To tilt stage 801, any actuator 802–805 is deflected in the positive or negative Z direction, transmitting torque that rotates stage 801 out of the XY plane. For example, deflecting only actuator 804 upward rotates stage 801 about the X axis. Simultaneously deflecting actuator 802 downward reinforces this X-axis rotation of stage 801. Similarly, a Z-axis deflection of actuator 803 and/or 805 produces a Y-axis rotation of stage 801. On the other hand, simultaneous outward deflection or simultaneous inward deflection in the XY plane of all four actuators produces a net rotation of stage 801 in the XY plane about the Z-axis. Various combinations of deflections of the respective actuators can generate more complex rotations about arbitrary axes. In the arrangement of FIG. 8, coupled actuators 802–805 provide a range of motion that closely approaches but typically does not equal that of single actuator 500 described in connection with FIG. 1A through FIG. 7.

Prior art actuators provide motion in one direction only. For example, the '325 patent, cited above, describes a stage coupled with four actuators that move only up or down relative to a substrate, without providing any lateral movement. Quadmorph actuators offer an additional degree of freedom that prior art thermal bimorphs for example do not permit. Embodiments of the present invention enable a single quadmorph microactuator to move both in-plane and out-of-plane.

In robotics technology, for example, there are two different classes of robotic manipulators, series linkage manipulators and parallel linkage manipulators. (See for example, "A Mathematical Introduction to Robotic Manipulation," R. Murray, et al., CRC Press, New York, pp. 132, 1994. In series linkage of manipulators, XYZ motion requires one stage that moves in X, then an attached Y stage and on top of that a Z stage. To produce motion only in the X direction at the end of the Z stage, only the X stage is activated. To produce motion only in the Y direction, only the Y stage is activated. To produce motion in Z, only the Z stage is activated. Essentially three actuators are cascaded to obtain three degrees of freedom.

In an alternative configuration called parallel linkage, actuators can generally produce motion in XY and Z as well, but to move in X, more than one actuator is activated. For example, in FIG. 8 as described above, to translate stage 801 uniformly vertically from the substrate requires activation of all four actuators. In essence, this is a parallel actuated scheme, because four actuators are required cooperatively to produce Z motion. A quadmorph is essentially a parallel linkage actuator, whereas the prior art describes a cascaded series type actuator.

A single quadmorph actuator provides an XY or XZ in-plane or out-of-plane motion with only one actuator, instead of requiring a cascaded pair of actuators. The stage configuration described in the '949 patent, cited above, provides motion in three directions, but requires a set of three cascaded actuators. The prior art technology requires two cascaded actuators to equal the performance of a single quadmorph actuator.

On a larger centimeter or multiple centimeter scale, piezoelectric actuators have been applied to position scanning tunneling microscopes and scanning probe microscopes (see for example, Chen, "Introduction to Scanning Tunneling Microscopy," Oxford University Press, 1993, pp. 224–233). A common configuration uses a hollow cylinder of piezoelectric material (e.g., ceramic) with four electrode segments attached around the circumference and running the length of the tube. One end of the tube is anchored and the other end is free to move. The free end of the tube moves in XY coordinate space normal to the cylinder axis in response to voltages applied to the four electrodes. This behavior is analogous to that of a quadmorph actuator and of the parallel linkage class of robotic manipulators. However, unlike the present quadmorph actuators which have at least one dimension on a micron scale and are thermally actuated, the piezoelectric tube is much larger scale and is driven using a piezoelectric effect.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system operable to provide independently controllable movement in a plurality of directions, said system comprising:

at least one microactuator comprising a plurality of substantially parallel longitudinal beams, each of said beams having a cross-sectional area, a base end that is independently positionally fixed, and an opposing free end that is not positionally fixed, said plurality of beams being coupled together such that the free ends of all of said plurality of beams are interconnected physically with one another;

said plurality of beams controllably operable responsive to induced thermal expansion of at least one of said plurality of beams to move said interconnected free ends as a unit in at least one direction in each of at least two intersecting lateral planes; and a stage interconnected with a plurality of said microactuators, said stage operable to move controllably in a plurality of directions in response to independently controllable movement of said interconnected free ends of said plurality of said microactuators.

2. The system of claim 1 wherein said plurality of directions comprise combinations of three translational degrees of freedom and three rotational degrees of freedom.

3. The system of claim 1 wherein said stage is interconnected via a flexure with each microactuator of said plurality of microactuators.

4. The system of claim 1 wherein said plurality of said microactuators comprise at least four said microactuators.

5. The system of claim 4 wherein said at least four microactuators are disposed in a substantially planar stepwise rotationally symmetric configuration about said stage.

6. A method operable to provide independently controllable movement in a plurality of directions, said method comprising the steps of:

in a microactuator comprising a plurality of substantially parallel longitudinal beams each of said beams having a cross-sectional area, a base end that is independently positionally fixed, and an opposing free end that is not positionally fixed, said plurality of beams being coupled together such that the free ends of all of said plurality of are interconnected physically with one another, selectively thermally expanding at least one of said beams relative to all other beams of said plurality of beams;

via said differential thermal expansion, transmitting a bending moment to said plurality of beams;

in response to said bending moment, deflecting said interconnected free ends as a unit controllably in a selectable direction in either of at least two intersecting lateral planes; and driving a stage interconnected with a plurality of said microactuators, said stage driven to move controllably in a plurality of directions in response to independently controllable movement of said plurality of said microactuators.

7. The method of claim 6 wherein said plurality of directions comprises combinations of three translational degrees of freedom and three rotational degrees of freedom.

8. The method of claim 6 wherein said plurality of said microactuators comprise at least four said microactuators.

* * * * *